United States Patent [19]

Winter

[11] Patent Number: 5,469,063

[45] Date of Patent: Nov. 21, 1995

[54] METHOD AND APPARATUS FOR TESTING FOR A HIGH VOLTAGE ON THE CHASSIS OF AN ELECTRONIC APPARATUS

[75] Inventor: Robert A. Winter, Sioux Falls, S. Dak.

[73] Assignee: Bowden's Automated Products, Inc., Viborg, S. Dak.

[21] Appl. No.: 110,519

[22] Filed: Aug. 23, 1993

[51] Int. Cl.⁶ ............................................. G01R 31/02
[52] U.S. Cl. .......................................... 324/508; 324/510
[58] Field of Search ......................... 324/133, 508, 324/509, 510, 511; 340/649, 650; 361/42, 55

[56] References Cited

U.S. PATENT DOCUMENTS

| | | | |
|---|---|---|---|
| 3,323,041 | 5/1967 | Warner | 324/510 |
| 3,611,133 | 10/1971 | Tsergas et al. | 324/510 |
| 3,648,163 | 3/1972 | Pinner et al. | 324/510 |
| 3,723,863 | 3/1973 | Myers | 324/510 |
| 3,727,105 | 4/1973 | Hochheiser | 361/55 |
| 3,728,617 | 4/1973 | Potter | 324/508 |
| 3,766,435 | 10/1973 | Childers | 361/42 |
| 3,783,340 | 1/1974 | Becker | 361/50 |
| 3,798,540 | 3/1974 | Darden et al. | 324/508 |
| 3,836,844 | 9/1974 | Prugh | 324/508 |
| 3,868,566 | 2/1975 | Parsons et al. | 324/510 |
| 3,878,458 | 4/1975 | Muska | 324/508 |
| 3,898,557 | 8/1975 | Strock | 324/508 |
| 4,029,996 | 6/1977 | Miffitt | 324/510 |
| 4,164,701 | 8/1979 | Gulledge et al. | 324/508 |
| 4,292,585 | 9/1981 | Charette | 324/510 |
| 4,352,058 | 9/1982 | Westra | 324/508 |
| 4,394,615 | 7/1983 | Rocci, Jr. | 324/510 |
| 4,642,554 | 2/1987 | Aucoin | 324/511 |
| 4,868,505 | 9/1989 | Stahl | 324/511 |
| 4,868,702 | 9/1989 | Itou et al. | 324/510 |
| 4,897,606 | 1/1990 | Cook et al. | 324/509 |
| 4,979,070 | 12/1990 | Bodkin | 324/510 |

*Primary Examiner*—Kenneth A. Wieder
*Assistant Examiner*—Christopher M. Tobin
*Attorney, Agent, or Firm*—Patnaude, Videbeck & Marsh

[57] ABSTRACT

A test instrument for determining whether an apparatus has a high voltage on the chassis thereof includes a meter, a probe and a socket for receiving a plug from the device being tested. The device also has a plug for insertion into an AC outlet. The test device first tests to determine that the AC outlet into which it is plugged is properly configured, then tests for a voltage on the chassis of a tested apparatus. The test is undertaken by connecting both the high and low contacts of the plug from an apparatus to be tested to the high voltage side of an outlet and connecting the probe to the ground contact of an outlet. Thereafter, when the probe is touched to the chassis of the apparatus the meter will indicate whether a voltage is present on the chassis of the appliance.

3 Claims, 2 Drawing Sheets

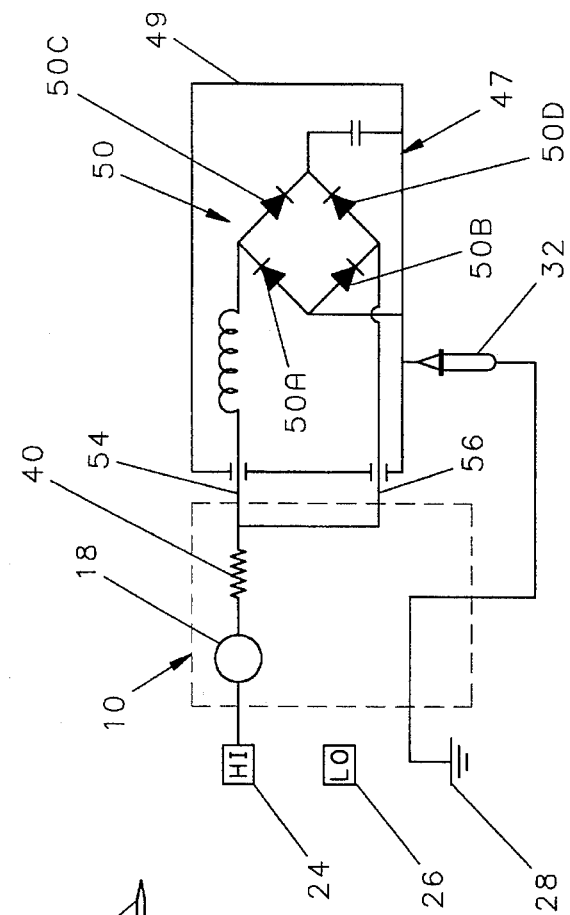
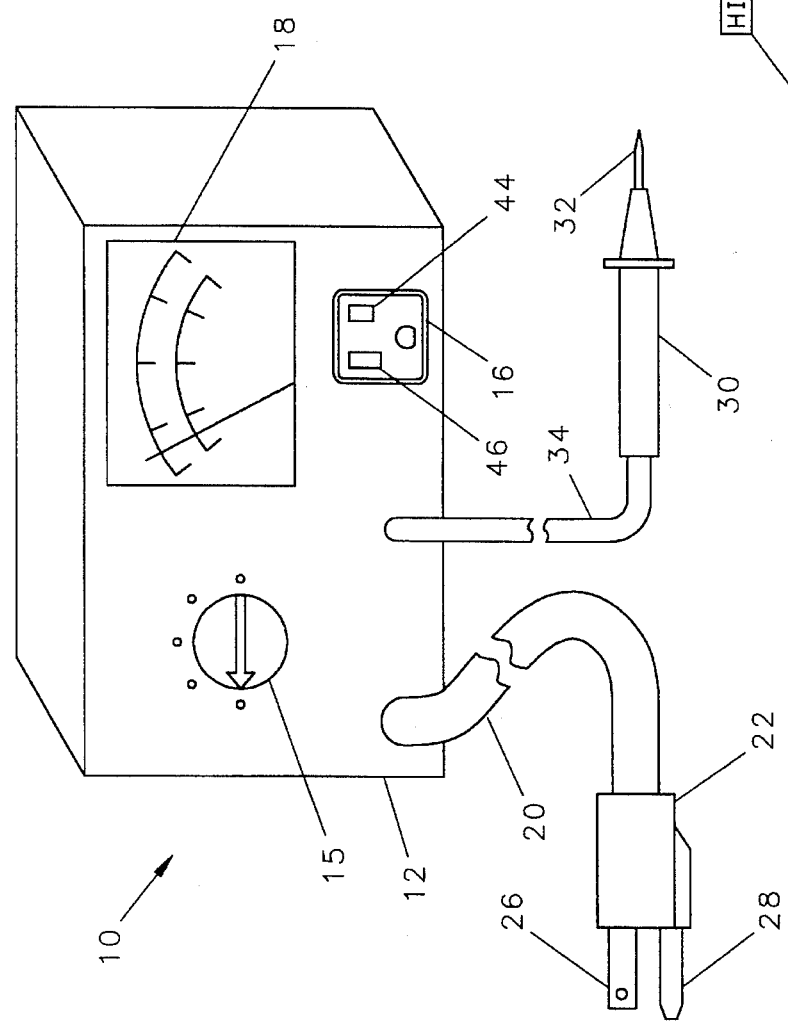
FIG. 3
FIG. 1

5,469,063

METHOD AND APPARATUS FOR TESTING FOR A HIGH VOLTAGE ON THE CHASSIS OF AN ELECTRONIC APPARATUS

The present invention relates to a method and apparatus for testing for a high voltage on the chassis of an electronic apparatus, and in particular to the method to be used by service technicians to test the chassis of the apparatus for a high voltage prior to the servicing thereof.

BACKGROUND OF THE INVENTION

Increasingly, equipment such as television receivers, radios, VCRs, and the like, are being constructed without power transformers, and as a result, they may be constructed to apply a high voltage to the chassis thereof. Furthermore, short circuits sometimes occur in equipment which causes a high voltage to be applied to the chassis. To avoid the danger of shock during service of such equipment, it is desirable to first test the chassis of the equipment to determine whether it is subjected to a high voltage. A technician working on equipment which has a high voltage on the chassis thereof without being aware of the condition may not only be subjected to personal danger, but may damage or destroy the test equipment being used, or the equipment being worked on.

Previously, technicians have resorted to their own creativity to devise a test for a high voltage on a chassis. Any such testing is time consuming, and with the growing reliance on transformerless chasses, there is a growing need for a device which can be used to test any equipment for a high voltage on the chassis thereof.

SUMMARY OF THE INVENTION

Briefly, the present invention is a method and apparatus for testing electronic equipment which operate on the power from a conventional AC outlet. The test instrument has a conventional power plug of the type having a high voltage male contact, a low voltage male contact and a ground male contact for insertion into a typical AC outlet having correspondingly located high voltage, low voltage and ground female receptacles.

The test instrument includes a means for testing for an AC voltage, such as a volt meter, and a rotary switch for selection of one of a plurality of tests to be performed. A first test confirms that a correct potential exists between the high and the low voltage contacts of the plug of the test device which is inserted into the AC outlet, thereby verifying that an AC potential exists across these contacts of the outlet. A second test verifies that an AC potential exists between the high voltage and ground contacts of the plug, thereby verifying that the desired potential exists between these contacts of the outlet into which the male contacts of the plug are inserted. A third test confirms that no substantial AC potential exists between the ground contact and the low voltage contact of the plug of the test device and therefore that the complimentary contacts of the AC outlet into which the plug is inserted are not subjected to an AC potential difference. The foregoing tests should be made on each outlet into which the test instrument is plugged before the instrument is to be used for the testing of equipment.

A test instrument constructed in accordance with a preferred embodiment of the invention includes an AC socket into which a piece of equipment to be tested can be plugged. To test the equipment for a high voltage on the chassis thereof after satisfactorily completing the first three tests, the test instrument is switched to a fourth configuration wherein the female contacts of the AC socket which are intended to receive a high voltage male contact and a low voltage male contact are connected together and to the high voltage male contact of the plug of the test device. A conductive probe connected to the ground contact or the low voltage contact of the test instrument is then used to contact the surface of the chassis of the equipment. In this configuration, the voltmeter will measure any potential between the probe and the joined high and low voltage contacts of the AC socket, and if for any reason, there is a high voltage on the chassis, the meter will display it.

After completion of the test the device can be switched to a fifth configuration whereby the high voltage contact of the outlet plug from the test device is electrically connected to the high voltage contact of the AC socket, the low voltage contact of the plug is connected to the low voltage contact of the AC socket, and the ground contact of the plug is connected to the ground contact of the AC socket, such that the power received through the outlet plug of the test device is applied to the socket and therefore to the equipment being tested without disconnecting the equipment under test from the test instrument.

BRIEF DESCRIPTION OF THE DRAWINGS

A better understanding of the present invention can be had from a review of the following detailed description taken in conjunction with the accompanying drawings wherein:

FIG. 1 is a front isometric view of a test device embodying the present invention;

FIG. 3 is a simplified schematic diagram of a piece of equipment to be tested which includes a full wave bridge rectifier adapted to apply a high voltage to the chassis thereof.

DETAILED DESCRIPTION OF A PREFERRED EMBODIMENT

Figure 2:
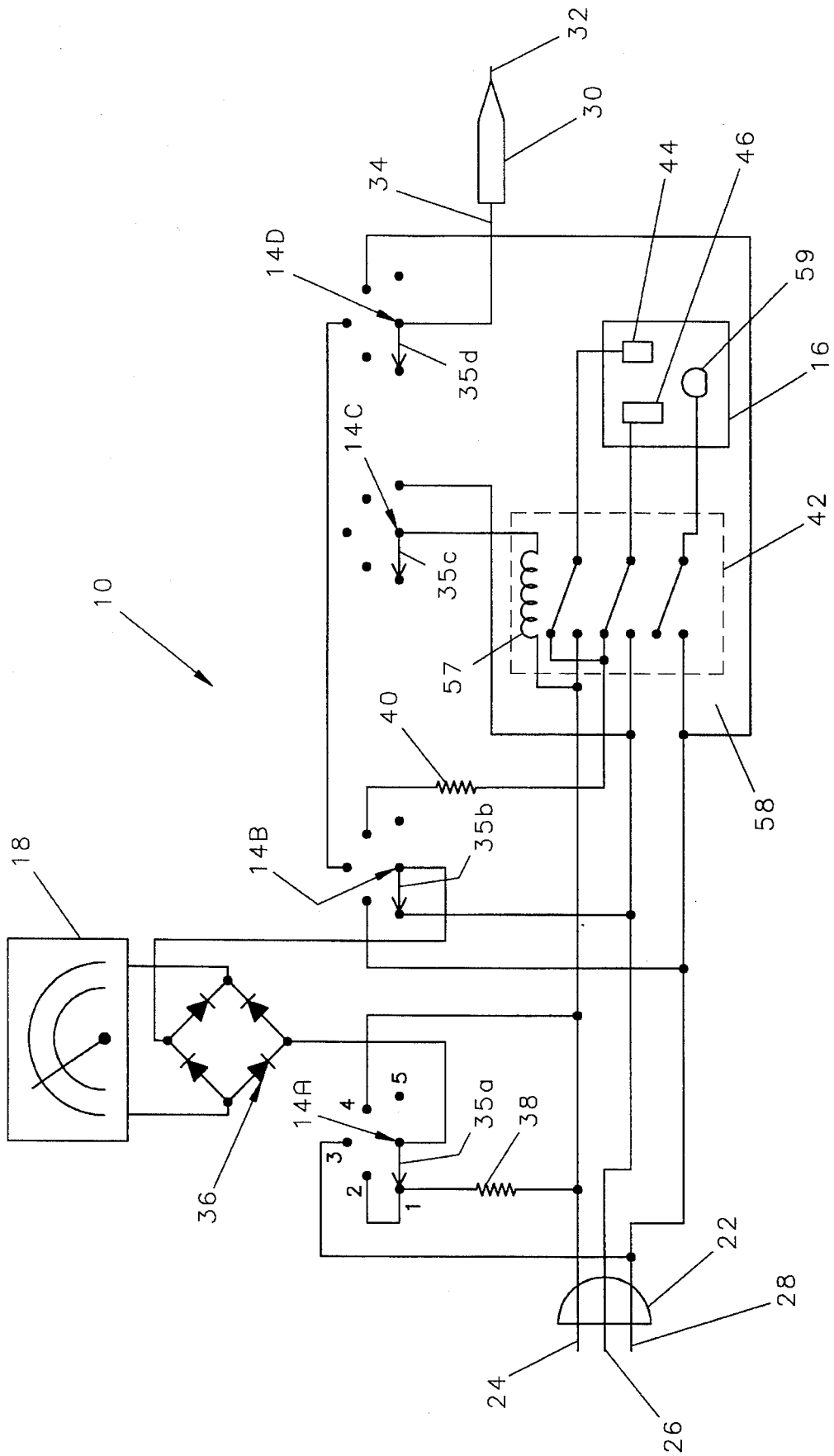
FIG. 2 is a schematic circuit diagram of the test device shown in FIG. 1.

Referring to FIG. 1, a test device 10 has an enclosure 12, a rotary selector switch 14 having a control knob 15 which can be adjusted to any of five selected settings, an AC outlet socket 16, and a meter 18. A power line 20 extends from the front panel of the enclosure 12 and is connected at the distal end thereof to an AC connector 22 of the type having a high voltage male prong or contact 24, a low voltage male prong or contact 26, and a ground male prong or contact 28. The device also includes a test probe 30 having an electrically conductive tip 32 which is connected by an insulated lead 34 extending from the front panel of the enclosure 12.

Referring to FIG. 2 in which it can be seen that the rotary switch 14 has four switching sections, 14a, 14b, 14c, 14d. Each of the four switching sections has five stationary contacts, respectively labelled 1 through 5, and each switching section has a wiper 35a, 35b, 35c, 35d. These wipers are ganged together on a common shaft to which the knob 15 is connected for simultaneous operation. The test instrument also includes a full wave diode rectifier bridge 36, a plurality of current limiting resisters 38 and 40, and a relay 42.

When the plug 22 for the instrument is fitted into a conventional AC outlet which is properly wired to apply AC power to the outlet, the high voltage contact 24 will be attached to the high voltage side of the AC power source, the low voltage contact 26 will be attached to a grounded connection as will be the ground contact 28. When the control knob 15 of the switch 14 is positioned in contact with the contacts 1 of the switch sections as depicted in FIG. 2, AC current from the high voltage contact 24 will be directed through the current limiting resister 38, through wiper 35*a*, through the bridge rectifier 36, the meter 18 and then through wiper 35*b* to the low voltage contact 26. When the switch 14 is positioned in contact with contacts 1, switching sections 14*c* and 14*d* are not utilized in the circuit. With the switch 14 in this position the test circuit is configured such that the meter 18 will display any potential which exists between the female contacts of the AC outlet, not shown, which receive the high voltage contact 24 and the low voltage contact 26 of the plug 22 of the test device 10. If the AC outlet into which the plug 22 is inserted is properly wired, the meter will confirm the existence of 120 volts across these terminals, or such other potential difference which the outlet is intended to provide.

When the knob 15 of switch 14 is thereafter positioned to the second selection, AC current will again flow through the current limiting resister 38, across wiper 35*a* to the bridge rectifier 36, through the meter 18, through wiper 35*b* to the ground contact 28. If the AC outlet, now shown, into which the plug 22 is inserted is properly wired, the display of the meter 18 will then verify the existence of an expected potential between the high voltage contact 24 and the ground contact 28.

When the knob 15 of the switch 14 is in the third position, the test circuit is configured such that the bridge rectifier 36 and meter 18 are connected by wipers 35*a*, 35*b* and 35*d* between the ground contact 28 and the tip 32 of the probe 30. When in this configuration, the probe 30 can be used to contact a water pipe or the like to reach an earth ground. If the outlet to which the plug 22 is connected into is properly wired, the meter 18 will reflect that there is little or no potential difference between the ground contact 28 and earth ground when the contact of the tip 32 of the probe 30 is connected to the earth ground, not shown.

If the foregoing tests result in the determination that the outlet into which the plug 22 is inserted is properly configured, knob 15 of the switch 14 can be set to the fourth test position. In the fourth position the test circuit is configured such that AC current from the high voltage contact 24 is connected through wiper 35*a* to the bridge rectifier 36 and the meter 18 and through wiper 35*b*, through current limiting resister 40 to both the female high voltage contact 44, and the female low voltage contact 46 of the socket 16. Also, the ground contact 28 is connected through wiper 35*d* to the tip 32 of the probe 30. Referring to FIG. 3, when a device is in the fourth test position, a piece of equipment which is to be tested can be plugged into the AC socket 16 and electric current entering the test device 10 through the high voltage contact 24 will be applied to both the high voltage contact and the low voltage contact of an apparatus 47 plugged therein. Thereafter, the chassis 49 of the apparatus 47 can be contacted with the tip 32 of the probe 30, and if there is a high voltage on the chassis, a current will flow through the probe 30 and the meter 18 will indicate that a high voltage is present on the chassis.

If the apparatus 47 has a transformer which is not shorted, the meter will indicate that there is no significant current passing through the probe 30, and therefore that there is no voltage on the chassis 49 of the apparatus 47. On the other hand, if there were a short circuit from a primary winding of the transformer to ground, there would be a current which will be limited by the resister 40, and such voltage will be detected by the meter 18. Similarly, if the apparatus has a transformerless chassis with a voltage thereon as shown in FIG. 3, current will again pass through the limiting resister 40 and be detected by the meter 18 thereby warning the technician of the danger. It should be appreciated that identical results would be achieved if the low voltage contact 26 were connected to the tip 32 of the probe instead of the ground contact 28.

Referring further to FIG. 3, in the event the equipment under test 47 includes a bridge rectifier 50 having diodes 50*a*, 50*b*, 50*c*, 50*d*, configured such that a high voltage is normally applied to the chassis 49 thereof, the test device 10 will again detect a potential between the chassis 49 and ground. The attachment of the high voltage line 54 and the low voltage line 56 of the apparatus 47 to the high voltage contact 24 of the test device 10 again results in the application of a voltage through diodes 50*a* and 50*c* thereby applying a voltage to the chassis 49 which will be indicated by the meter 18 when the chassis 49 is contacted by the probe 30. Even if the plug of the apparatus 47 has been incorrectly connected such that the high voltage line 54 is attached to the contact adapted to fit into the low voltage female contact of an AC outlet, the present invention will detect a voltage on the chassis. Since both the high voltage line 54 and the low voltage line 56 are attached to a high voltage source, current will again pass through diodes 50A and 50B to the chassis 49 and be detected by the meter 18 when the chassis 49 is contacted by the probe 30.

Once it has been determined that the equipment 47 to be tested does not have a high voltage on the chassis, and the technician is ready to service the apparatus, the knob 15 of the switch 14 can be set to the fifth position in which current passes across wiper 4C through the coil 57 to energize the relay 42. The relay 42 actuates a triple pole switch 58 which connects the high voltage contact 24, the low voltage contact 26 and the ground contact 28 of the plug 22 to the corresponding high, low and ground contacts 44, 46, 59 respectively of the socket 16. In this configuration, the apparatus can be operated with proper power applied to the plug of the apparatus while it is being serviced.

To operate the test instrument 10, a technician should first test any outlet into which the test device 10 is to be plugged. To do so, the test device is plugged into the outlet, not shown, and the tests corresponding to the first three settings of the device undertaken to confirm that the outlet is properly wired. The piece of equipment to be tested may be plugged into the socket 16 prior to undertaking the first three tests without exposing the equipment to damage from an improperly wired outlet. After the first three sets are completed, the knob 15 of the test instrument is set to the fourth position, and if the equipment to be tested has not been previously fitted into the socket 16, it should be connected at this time. The probe 30 is then contacted to the chassis of the equipment to be tested, and if it has a high voltage thereon, the meter 18 will read the voltage and warn the technician. After the test is completed and it is determined that the chassis is not at a high voltage, the knob 15 of the switch 14 can be set to the fifth position and the technician can commence servicing the equipment under test.

While preferred embodiments of the present invention have been disclosed, it will be apparent to those skilled in the art that many changes and modifications may be made without departing from the true spirit and scope of the invention. It is therefore the purpose of the appended claims to cover all such changes and modifications which fall within the true spirit and scope of the invention.

What is claimed:

1. An instrument for testing a piece of electronic equipment, said piece of electronic equipment being of the type which has an AC plug having a high voltage contact, a low voltage contact, and the piece of equipment also having a chassis, said device comprising in combination:

connector means for connecting said instrument to a source of AC power, said connector means including a high voltage contact and a low voltage contact.

a socket for receiving an AC plug of a piece of electronic equipment, said socket having means for receiving a high voltage contact and means for receiving a low voltage contact, first circuit means for conductively connecting said high voltage contact of said connector means to said means for receiving a high voltage contact and conductively connecting said low voltage contact of said connector to said means for receiving a low voltage contact, second circuit means for simultaneously connecting both said high voltage contact and said low voltage contact of said electronic equipment directly to said high voltage contact of said connector means, a conductive probe having a tip and a lead extending therefrom, said lead connected to a ground, detection means along said lead for detecting a potential between said high voltage contact of said source of AC power to said tip of said probe when an AC plug of a piece of electronic equipment is inserted into said socket and said tip of said probe is contacted against the chassis of a piece of electronic equipment, and said connector is attached to a source of AC power, switch means for selectively configuring one of said first circuit means and said second circuit means;

third circuit means for testing for an AC potential between said high voltage contact and said low voltage contact of said connector means when said connector means is connected to a source of AC power, fourth circuit means for testing for an AC potential between ground and said high voltage contact of said connector means when said connector means is connected to a source of AC power, fifth circuit means for testing for an AC potential between a ground contact of said instrument and earth ground, and second switch means for selectively configuring said instrument for one of said first circuit means, said second circuit means, said third circuit means, said fourth circuit means, and said fifth circuit means.

2. An instrument for testing a piece of electrically operated equipment for a voltage on a chassis thereof wherein said piece of electrically operated equipment is of the type which operates from a conventional AC outlet and has a conventional plug, said instrument comprising in combination:

a plug attached to said instrument, said plug having a high voltage contact, a low voltage contact and a ground contact for insertion into an AC outlet for receiving said plug, first means for testing for an AC potential between said high voltage contact and said low voltage contact of said plug attached to said instrument when said plug is inserted into an AC outlet, second means for testing for an AC potential between said high voltage contact and said ground contact of said plug attached to said instrument when said plug is inserted into an AC outlet, third means for testing for an AC potential between said ground contact of said plug attached to said instrument and earth ground when said plug is inserted into an AC outlet, an AC socket on said instrument having means for receiving a high voltage contact and means for receiving a low voltage contact of a piece of electrically operated equipment to be tested, first circuit means for simultaneously conductively connecting said means for receiving a high voltage contact and said means for receiving a low voltage contact of a piece of electrically operated equipment to each other and to said high voltage contact of said plug attached to said instrument, second circuit means for conductively connecting said high voltage contact to said means for receiving a high voltage contact and said low voltage contact to said means for receiving a low voltage contact, selector switch means for selectively configuring said instrument for operation of one of said first circuit means, said second circuit means, said first means, said second means and said third means, a conductive probe having a tip and a lead extending from said tip and, means for detecting a potential between said tip of said probe and said means for receiving a high voltage contact and said means for receiving a low voltage contact of said socket, when said selector switch means configures said instrument for operation of said first circuit means and a plug of a piece of electrically operated equipment is inserted into said AC socket means and said tip of said probe is contacted to a chassis of the piece of electrically operated equipment.

3. An instrument in accordance with claim 2 further comprising display means for displaying any potential detected in said first means, said second means, said third means, and said means for detecting a potential between said tip of said probe and said means for receiving a high voltage contact.

* * * * *